United States Patent [19]

Kawakami

[11] Patent Number: 5,532,647
[45] Date of Patent: Jul. 2, 1996

[54] RECEIVER HAVING ACG CIRCUIT

[75] Inventor: Yasuo Kawakami, Kawagoe, Japan

[73] Assignee: Pioneer Electronic Corporation, Tokyo-to, Japan

[21] Appl. No.: 321,981

[22] Filed: Oct. 12, 1994

[30] Foreign Application Priority Data

Oct. 12, 1993 [JP] Japan .................. 5-254064

[51] Int. Cl.$^6$ .................................................. H03G 3/30
[52] U.S. Cl. .................. 330/284; 455/249.1; 330/302
[58] Field of Search ......................... 330/136, 144, 330/145, 284, 302; 333/81 R; 455/234.1, 239.1, 249.1

[56] References Cited

U.S. PATENT DOCUMENTS

| | | | |
|---|---|---|---|
| 4,019,160 | 4/1977 | Kan | 330/302 X |
| 4,218,774 | 8/1980 | Kondo | 455/249.1 X |
| 4,222,066 | 9/1980 | Zelenz | 333/81 R X |
| 4,393,513 | 7/1983 | Yokogawa et al. | 330/284 X |

*Primary Examiner*—Steven Mottola
*Attorney, Agent, or Firm*—Kane, Dalsimer, Sullivan, Kurucz, Levy, Eisele and Richard

[57] ABSTRACT

A high frequency signal is inputted to a receiver from an antenna for receiving the high frequency signal. The receiver is provided with: an amplifier element for amplifying the inputted high frequency signal; n (n: natural number not less than 2) pieces of coil elements, which are serially connected between the antenna and an input side of the amplifier element and construct a low pass filter for the inputted high frequency signal; and an AGC circuit including an impedance variable device, which is connected at one end thereof to an intermediate connection point of two coil elements adjacently disposed in the n pieces of coil elements and is connected at the other end thereof to a ground, and which impedance between one end and the other end is varied in accordance with a level of the inputted high frequency signal, for controlling an input level of the inputted high frequency signal for the amplifier element by changing an attenuation characteristic thereof in accordance with the change in the impedance of the impedance variable device.

8 Claims, 8 Drawing Sheets

RECEIVER HAVING ACG CIRCUIT

BACKGROUND OF THE INVENTION

1. Field of the Invention

The present invention relates to a receiver having an AGC (Automatic Gain Control) circuit.

2. Description of the Related Art

In a receiver having an AGC circuit, when it is receiving the broadcast near the upper edge of the MW (Medium Wave) band (i.e. not less than 1500 kHz), there arises a problem that the receiving disturbances are generated due to the receiving interference and the degradation in sensitivity.

Figure 7A:
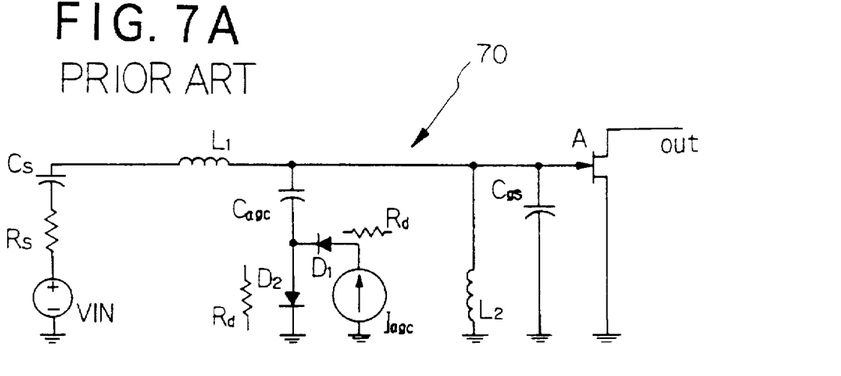
FIG. 7A is a circuit diagram of a receiver according to one related art.

One example of such a receiver having the AGC circuit is shown in FIG. 7A.

In FIG. 7A, a resistor Rs (=80Ω, for example) and a capacitor Cs (=80 pF, for example) represents an antenna impedance in the MW band, and a VIN represents an antenna induced voltage. The receiver is provided with: a LPF (Low Pass Filter) coil $L_1$ (=several tens μH, for example) for cutting off the frequency not less than the SW band; a HPF (High Pass Filter) coil $L_2$ (=ten plus several mH, for example) for cutting off the frequency not more than the LW band; and a FET (Field Effect Transistor) A. A capacitor Cgs (=ten plus several pF, for example) represents the total of an input capacitance and an stray capacitance of the FET A. An AGC circuit is constructed by a capacitor Cagc (=several thousands pF, for example), and diodes $D_1$ and $D_2$, such that the AGC is operated when the operative resistances Rd of the diodes $D_1$ and $D_2$ are decreased. An electric current source Iagc changes the operative resistances Rd of the diodes $D_1$ and $D_2$.

Figure 7B:
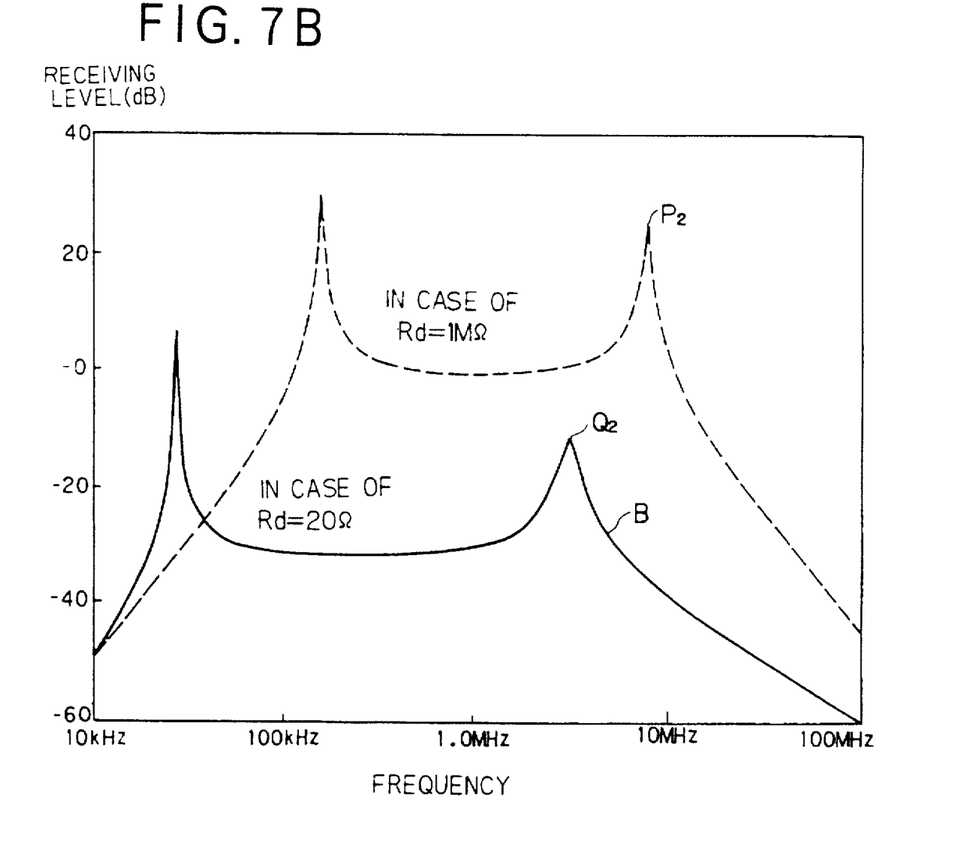
FIG. 7B is a frequency characteristic of the receiver of FIG. 7A.

The inventor of the present application conducts a simulation as for the frequency characteristic of the receiver of FIG. 7A, and the result of the simulation is shown in the graph of FIG. 7B.

In the graph of FIG. 7B, when the AGC is not operated and thus each of the operative resistances Rd of the diodes $D_1$ and $D_2$ is 1 MΩ, a peak P2 is located at the vicinity of 8 MHz by virtue of the LPF coil $L_1$ and the capacitor Cgs. When the AGC is sufficiently operated and thus each of the operative resistances Rd becomes several tens Ω e.g. 20Ω by virtue of the electric current source Iagc, the peak P2 is moved downward to a peak Q2 located at the vicinity of 3 MHz (or not more than this value) since the composite capacitance of the capacitor Cs and the capacitor Cagc becomes dominant. Since a slope B of this peak is positioned at the vicinity of the upper edge of the MW band (not less than 1500 kHz), the phenomenon that the AGC range runs short (i.e. the AGC becomes difficult to be operated) occurs, and the aforementioned problem is raised. In the above explained simulation, the frequency is the result of the calculation and the actual frequency is slightly higher than that in the simulation.

In this manner, the inventor of the present invention has found the fact that the cause of the problem (e.g. the receiving disturbances due to the receiving interference and the degradation in sensitivity) is such a frequency characteristic that the operation range of the AGC circuit of the MW receiver is varied depending on the frequency.

In order to overcome this problem, it may become necessary that the peak frequency at which the AGC is operated, is set to a frequency which is at least several times as high as the receiving frequency.

As one solution, it may be proposed that the LPF coil $L_1$ is made small. However, in this case, the property to remove the unnecessary signals (e.g. FM signal, TV signal), which are unnecessary for the MW receiver having the frequency band not less than the SW band, is deteriorated.

Alternatively, it may be proposed that the capacitor Cagc is reduced. However, in this case, since the AGC operative range is determined by the ratio of the capacitors Cs and Cagc, the AGC operative range cannot be maintained as it is.

Here, it is to be noted that the capacity Cs is equivalent to the capacity of the antenna, and it is not possible to change this value by the design of the circuit.

In this manner, it is rather difficult to improve the receiver 70 shown in FIG. 7, by changing the parameters.

Figure 8A:
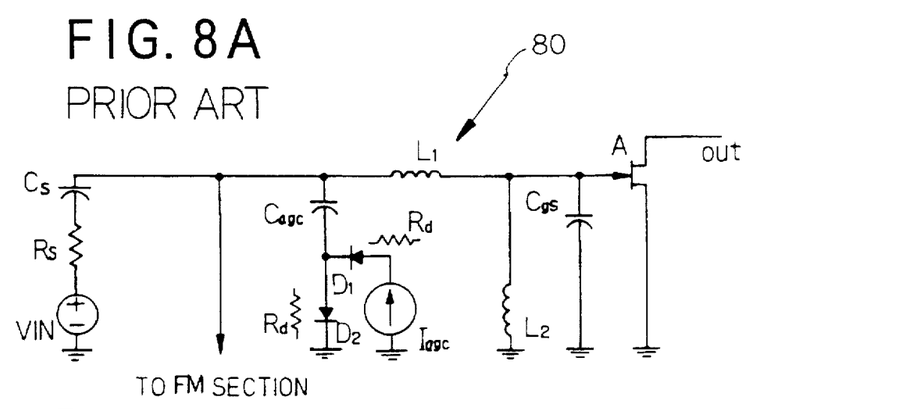
FIG. 8A is a circuit diagram of a receiver according to another related art.

There is another receiver having the AGC circuit to overcome the above mentioned problem, which is shown in FIG. 8A.

In FIG. 8A, the same elements as those in FIG. 7A, carry the same reference numerals and the explanation thereof are omitted. The difference between a receiver 80 of FIG. 8A and the receiver 70 of FIG. 7A, is the position of the LPF coil $L_1$.

Figure 8B:
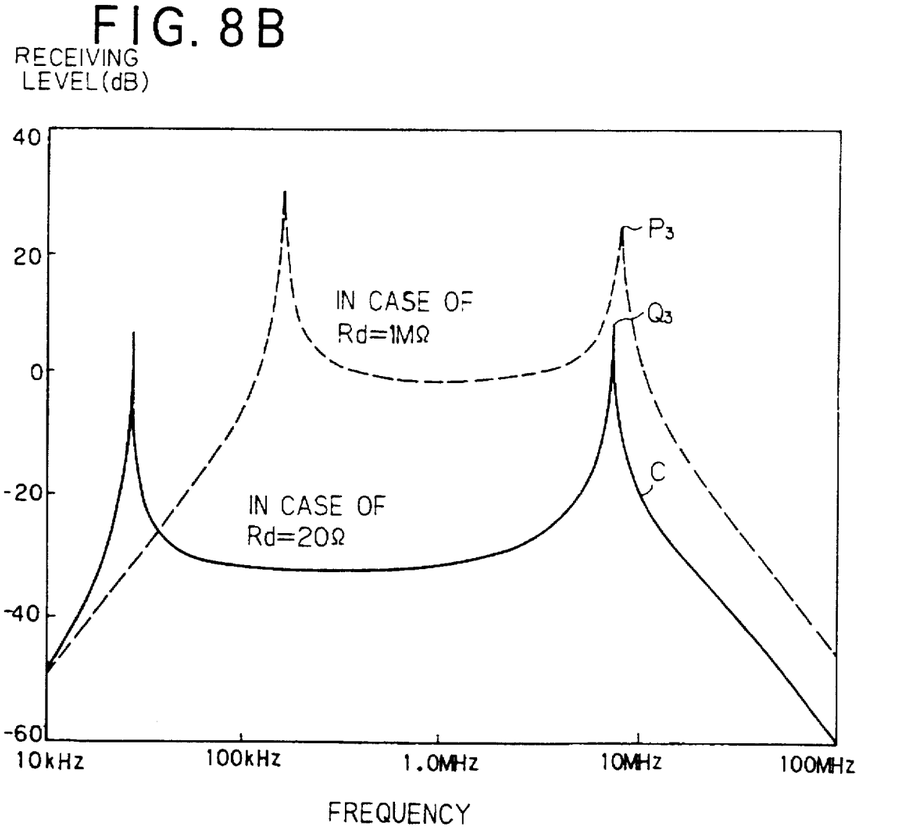
FIG. 8B is a frequency characteristic of the receiver of FIG. 8A.

The inventor of the present application again conducts a simulation as for the frequency characteristic of the receiver 80 of FIG. 8A, and the result of the simulation is shown in the graph of FIG. 8B.

In the graph of FIG. 8B, a peak P3 is located at the vicinity of 8 MHz when each of the operative resistances Rd of the diodes $D_1$ and $D_2$ is 1 MΩ, and the peak P3 is only slightly moved to a peak Q3 when the AGC is sufficiently operated (i.e. when the operative resistance Rd becomes 20Ω), so that the problem of the aforementioned receiver is solved. Namely, the peak Q3 in FIG. 8B is shifted to the higher frequency side by about 2 MHz as compared with the peak Q2 in FIG. 7B.

However, the receiver 80 of FIG. 8A still has following problems, since the capacitor Cagc and the diodes $D_1$ and $D_2$ are directly connected to the antenna.

Namely, it has a first problem that the capacitor Cagc, and the diodes $D_1$ and $D_2$ generate a distortion of the received signal for the higher frequency range outside of the MW band. This distortion becomes the cause of the receiving disturbance upon receiving the MW band, and also the receiving disturbance upon receiving the FM signal which is not shown in FIG. 8B, for example.

Since the capacitor Cagc becomes a low impedance in the band range from the FM band to the TV band, there is a high possibility that the distortion is generated due to the high level signal from the FM band to TV band.

It has a second problem that the electrostatic energy is directly applied to the capacity Cagc and the diodes $D_1$ and $D_2$ when the antenna static electricity is induced. In this case, the capacitor Cagc and the diodes $D_1$ and $D_2$ are not always destroyed at once. However, since an element to restrict the electrostatic energy (e.g. inductance or resistance) is little or nil, the stress applied to the capacitor Cagc and the diodes $D_1$ and $D_2$ are not negligible in some cases. This will happen in the same manner even if the AGC elements are the transistors, for example, in place of the diodes.

SUMMARY OF THE INVENTION

It is therefore an object of the present invention to provide a receiver having an AGC circuit, which can obtain the AGC effect homogeneously with respect to the wide receiving band range, and can be effective to the receiving disturbance due to the signal outside of the receiving band range.

The above object of the present invention can be achieved by a first receiver of the present invention, to which a high frequency signal is inputted from an antenna for receiving the high frequency signal. The first receiver is provided with: an amplifier element for amplifying the inputted high frequency signal; n (n: natural number not less than 2) pieces of coil elements, which are serially connected between the antenna and an input side of the amplifier element and construct a low pass filter for the inputted high frequency signal; and an AGC circuit including an impedance variable device, which is connected at one end thereof to an intermediate connection point of two coil elements adjacently disposed in the n pieces of coil elements and is connected at the other end thereof to a ground, and which impedance between one end and the other end is varied in accordance with a level of the inputted high frequency signal, for controlling an input level of the inputted high frequency signal for the amplifier element by changing an attenuation characteristic thereof in accordance with the change in the impedance of the impedance variable device.

In the construction of the first receiver of the present invention, the impedance variable device is connected to the intermediate connection point of the serially connected coil elements. Thus, the input level of the inputted high frequency signal for the amplifier element is controlled in accordance with the change in the impedance of the impedance variable device. Accordingly, a good AGC effect can be obtained in the wide receiving band range and especially in the upper side (i.e. high frequency side) of the receiving band range.

The above object of the present invention can be also achieved by a second receiver of the present invention, which has such a feature in addition to the above described feature of the first receiver that: m (m: natural number not less than 1 and not more than (n−1)) pieces of the n pieces of coil elements, construct a first coil portion disposed between the antenna and the impedance variable device; (n−m) pieces of the n pieces of coil elements construct a second coil portion between the impedance variable device and the amplifier element; and a self resonant frequency of the first coil portion is higher than that of the second coil portion.

In the construction of the second receiver of the present invention, the self resonant frequency of the first coil portion is higher than that of the second coil portion. Thus, in addition to the effect of the first receiver of the present invention, it becomes possible to substantially improve the tolerable input level of the amplifier element up to the generation of the distortion in case that the high frequency signal outside of the receiving band range is inputted. Accordingly, the influence of the receiving disturbance due to the high frequency signal outside of the receiving band range can be reduced.

The above object of the present invention can be also achieved by a third receiver of the present invention, which has such a feature in addition to the above described feature of the first receiver that: m (m: natural number not less than 1 and not more than (n−1)) pieces of the n pieces of coil elements, construct a first coil portion disposed between the antenna and the impedance variable device; (n−m) pieces of the n pieces of coil elements construct a second coil portion between the impedance variable device and the amplifier element; and a resonant frequency at the input side of the amplifier element is set to be higher than a receiving frequency range of the receiver in accompaniment with the change in the impedance of the impedance variable device.

In the construction of the third receiver of the present invention, the resonant frequency at the input side of the amplifier element is set to be higher than the receiving frequency range of the receiver in accompaniment with the change in the impedance of the impedance variable device. Thus, in addition to the effect of the first receiver of the present invention, it becomes possible to maintain the flatness of the AGC characteristic in the receiving band range so that the wide AGC range can be maintained.

The above object of the present invention can be also achieved by a fourth receiver of the present invention, to which a high frequency signal is inputted from an antenna for receiving the high frequency signal. The fourth receiver of the present invention is provided with: an amplifier element for amplifying the inputted high frequency signal; n (n: natural number not less than 2) pieces of coil elements, which are serially connected between the antenna and an input side of the amplifier element and construct a low pass filter for the inputted high frequency signal; and an AGC circuit including a resistance variable device, which is connected at one end thereof to an intermediate connection point of the n pieces of coil elements and the amplifier element and is connected at the other end thereof to a ground, and which resistance between one end and the other end is lowered when an input level of the inputted high frequency signal is lowered, for lowering a Q (Quality factor) of the coil elements by the change in the resistance of the resistance variable device while controlling the input level of the inputted high frequency signal for the amplifier element by changing an attenuation characteristic thereof.

In the construction of the fourth receiver of the present invention, a resistance of the resistance variable device is lowered when an input level of the inputted high frequency signal is lowered, and the Q of the coil elements is lowered by the change in the resistance of the resistance variable device. Thus, the generation of the peak in the AGC characteristic wave form due to the Q of the coil element can be restrained when the AGC is sufficiently operated. Accordingly, in addition to the effect of the first receiver of the present invention, it becomes possible to maintain the flatness of the AGC characteristic in the receiving band range so that the wide AGC range can be maintained.

The above object of the present invention can be also achieved by a fifth receiver of the present invention, to which a high frequency signal is inputted from an antenna for receiving the high frequency signal. The fifth receiver of the present invention is provided with: an amplifier element for amplifying the inputted high frequency signal; n (n: natural number not less than 2) pieces of coil elements, which are serially connected between the antenna and an input side of the amplifier element, construct a low pass filter for the inputted high frequency signal, and is divided into first, second and third portions, the first portion having i (i: natural number not less than 1 and not more than (n−1)) pieces of the n pieces of coil elements disposed between the antenna and a first connection terminal, the second coil portion having j (j: natural number not less than 1 and not more than (n−i)) pieces of the n pieces of coil elements disposed between the first connection terminal and a second connection terminal, the third coil portion having k (k=n−i−j) pieces of the n pieces of coil elements disposed between the second connection terminal and the amplifier element; and an AGC circuit including a resistance variable device, which is connected at one end thereof to the first connection terminal and the second connection terminal respectively and is connected at the other end thereof to a ground, and which resistances of the resistance variable device between the first connection terminal and the ground and between the second connection terminal and the ground are lowered when an input level of the inputted high frequency signal is lowered, for lowering a Q (Quality factor) of the coil elements by the Change in the resistances of the resistance variable device while controlling an input level of the inputted high frequency signal for the amplifier element by changing an attenuation characteristic thereof.

In the construction of the fifth receiver of the present invention, the resistances of the resistance variable device between the first connection terminal and the ground and between the second connection terminal and the ground are lowered when an input level of the inputted high frequency signal is lowered, and the Q of the coil elements is lowered by the change in the resistances of the resistance variable device. Thus, the generation of the peak in the AGC characteristic wave form due to the Q of the second coil portion can be restrained when the AGC is sufficiently operated. Accordingly, in addition to the effect of the first receiver of the present invention, it becomes possible to maintain the flatness of the AGC characteristic in the receiving band range so that the wide AGC range can be maintained.

The above object of the present invention can be also achieved by a sixth receiver of the present invention, which has such a feature in addition to the above described feature of the fifth receiver that a self resonant frequency of the first coil portion is set to be higher than that of the second and third coil portions in combination.

In the construction of the sixth receiver of the present invention, the self resonant frequency of the first coil portion is set to be higher than that of the second and third coil portions in combination. Thus, in addition to the effect of the fifth receiver of the present invention, it becomes possible to substantially improve the tolerable input level of the amplifier element up to the generation of the distortion in case that the high frequency signal outside of the receiving band range is inputted. Accordingly, the influence of the receiving disturbance due to the high frequency signal outside of the receiving band range can be reduced.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, embodiments of the present invention will be now explained.

First Embodiment

Figure 1A:
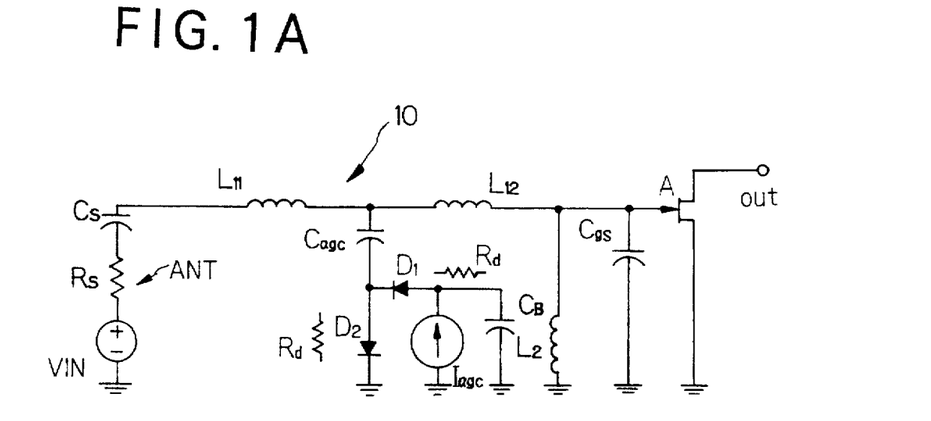
FIG. 1A is a circuit diagram of a receiver as a first embodiment of the present invention.
Figure 1B:
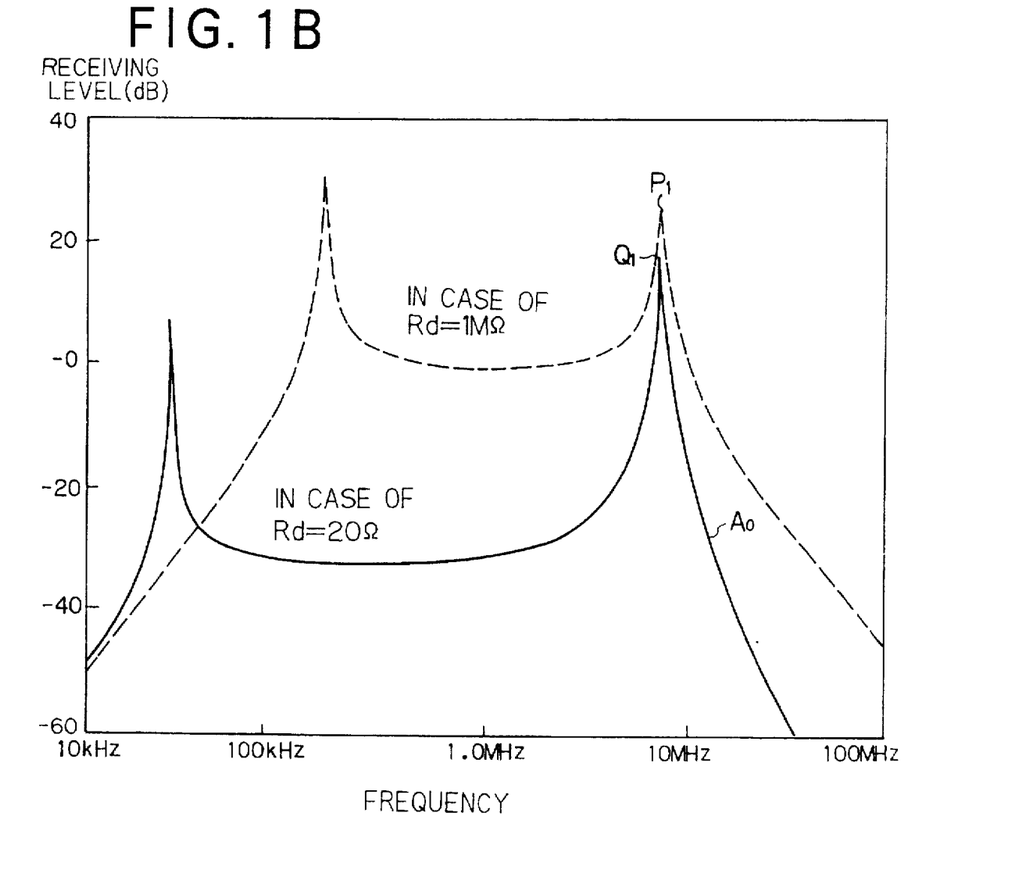
FIG. 1B is a frequency characteristic of the first embodiment of FIG. 1A.

FIG. 1A shows a receiver having an AGC circuit as a first embodiment of the present invention, and FIG. 1B shows a frequency characteristic of the receiver of FIG. 1A, which is obtained by a simulation.

In FIG. 1A, a receiver 10 is provided with: an antenna ANT having an antenna impedance, which is in the MW band and equivalent to the resistor Rs (=80Ω, for example) and a capacitor (=80 pF, for example) connected in serial with an antenna inducing voltage VIN; a coil $L_{11}$ (=several µH, for example) and a coil $L_{12}$ (=several tens µH, for example) which constitute a LPF coil for cutting off the frequency not less than the SW band; a coil $L_2$ (=10 mH, for example) which is a HPF coil for cutting off the frequency not more than the LW band; a FET (Field Effect Transistor) A as an amplifier element; a capacitor component Cgs (=ten plus several pF, for example) equivalent to the input capacitance and the stray capacitance of the FET; a capacitor Cagc for constituting the AGC circuit; diodes $D_1$ and $D_2$ for constituting the AGC circuit together with the capacitor Cagc, which are connected, at the intermediate connection point thereof, to the intermediate connection point of the coils $L_{11}$ and $L_{12}$; an electric current source Iagc for changing the operative resistances of the diodes $D_1$ and $D_2$; and a bypass capacitor $C_B$, which impedance becomes lower than the impedance of the capacitor Cagc at the operative band range.

In this case, the receiver 10 is constructed such that the AGC is operated when the operative resistances of the diodes $D_{11}$ and $D_{12}$ are lowered.

With referring to FIG. 1B, the frequency giving the peak P1 of the signal receiving level in case of Rd=1 MΩ, which is located at the vicinity of 8 MHz, is only slightly moved to the peak Q1 when the AGC is sufficiently operated (i.e. in case of Rd=20Ω). In this manner, the aforementioned problem of the receiver 70 of FIG. 7, is solved by the present embodiment. Namely, the peak Q1 of FIG. 1B is shifted to the higher frequency side as compared with the peak Q2 of FIG. 7B approximately by 2 MHz, and is positioned in the same frequency range as the peak Q3 of FIG. 8B.

Further, in the circuit diagram of FIG. 1A, the aforementioned first and second problems of the receiver 80 of FIG. 8, are solved or improved by the coil $L_{11}$ as explained below in detail.

As for the circuit diagrams of FIG. 7A and FIG. 8A, the simulation is not performed with considering self oscillation as for the coil $L_1$. However, the coil having several tens µH, has generally the self resonant frequency of several tens MHz (although it varies due to the construction). The coil having the smaller inductance has the tendency that the self resonant frequency is increased.

At the frequency higher than the self resonant position (frequency), the coil does not function as the original coil anymore, but functions as a capacitor. Thus, in the frequency range not less than the self resonant frequency, the effect of the coil $L_1$ as the LPF coil to prevent the generation of the signal, which frequency is higher than the SW band, is disappeared. For this reason, when the high level signal in the FM to TV band range is inputted, this signal is applied to the FET for receiving the MW band, so that the distortion is generated at the FET to disturb the MW reception even if there is no distortion at the capacitor Cage, and the diodes $D_1$ and $D_2$.

On the contrary, in the receiver of FIG. 1A, the coil $L_1$ of FIG. 7 or 8 is divided into the coil $L_{11}$ of several µH and the coil $L_{12}$ of several tens µH (in other words, the coil $L_{11}$ is added to the coil $L_{12}$). Further, the self resonant frequency of the coil $L_{11}$ is selected such that it is much higher than that of the coil $L_{12}$. Therefore, the input level, at which the distortion is generated by the FET when the high level signals in the FM to TV bands are inputted, is made higher than that of the circuit diagram of FIG. 7 or 8.

Namely, there is an effect to avoid the receiving disturbance due to the signals outside of the MW band (e.g. FM to TV bands).

The difference between the circuit of FIG. 1 according to the first embodiment and the circuit of FIG. 7 or 8 according to the related art, will be described below in more detail.

In the first embodiment, as shown in the graph of FIG. 1B, the slope AO of the LPF for cutting off the frequency higher than the oscillating position at about 8 MHz, is steep. Thus, as compared with the slope B of FIG. 7B or the slope C of FIG. 8B, there is an effect to prevent the influence of the frequency outside of the MW band. This is a characteristic effect of the present embodiment. According to the first embodiment, by combining the double stage LC filters (i.e. the coil $L_{11}$ and the capacitor Cage, and the coil $L_{12}$ and the capacitor Cgs) at the time of the AGC operation, the attenuation amount can be increased more than the case of the single stage LC filter according to the related art. This is the characteristic of the first embodiment, which cannot be brought by the circuit of FIG. 7A or 8A.

Nextly, various modes of the first embodiment will be explained. Instead of the construction shown in FIG. 1A, as long as the conditions (a) and (b) mentioned below, are satisfied, the advantageous effect of the above described first embodiment can be achieved in the same manner.

Namely, the condition (a) is that:

the serially connected coils $L_{11}$ and $L_{12}$ are arranged at positions from the antenna until the first stage FET of the MW band, while the capacitor Cage, diodes $D_1$ and $D_2$ etc. which construct the AGC are connected to the intermediate connecting point between the coils $L_{11}$ and $L_{12}$;

the diodes $D_1$ and $D_2$ may be replaced by transistors;

the capacitor Cage may be included in the AGC; and the coil $L_2$ as the HPF coil is not an indispensable constitutional element of the present embodiment.

The condition (b) is that:

the self inductance of the coil $L_{11}$ < the self inductance of the coil $L_{12}$; and the self resonant frequency of the coil $L_{11}$ is not less than the self resonant frequency of the coil $L_{12}$.

In the first embodiment, the coil equivalent to the coil $L_1$ is divided into just two coils i.e. the coil $L_{11}$ and the coil $L_{12}$.

However, as long as it fulfills the above mentioned conditions (a) and (b), the coil can be divided into more than two coils. More precisely, n (n: natural number more than 2) pieces of coil elements are prepared, wherein the first coil portion corresponding to the coil $L_{11}$ is constructed by m (m: natural number not less than one and not more than (n−1)) pieces of coil elements, and the second coil portion corresponding to the coil $L_{12}$ is constructed by (n−m) pieces of coil elements.

Second Embodiment

The above mentioned first embodiment has solved the aforementioned first and second problems of the receiver 80 of FIG. 8, by controlling the peak P1, which is positioned at the vicinity of 8 MHz when Rd=1 MΩ, to move only little when the AGC is sufficiently operated i.e. when Rd=20Ω as shown in FIG. 1B, and the AGC characteristic is made flat in the receiving band range (in other words, the frequency dependency of the AGC characteristic is reduced). On the contrary, the second embodiment is constructed such that it decreases the frequency dependency of the AGC characteristic over the wider frequency band range, and maintains the AGC range by controlling the peak at the vicinity of 8 MHz.

Figure 2A:
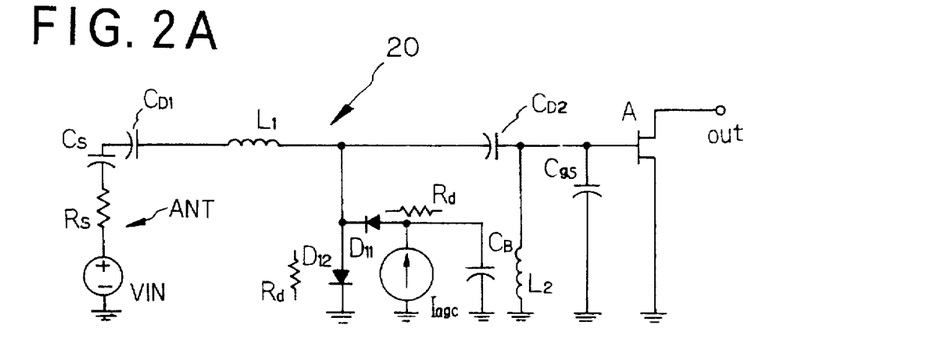
FIG. 2A is a circuit diagram of a receiver as a second embodiment of the present invention.
Figure 2B:
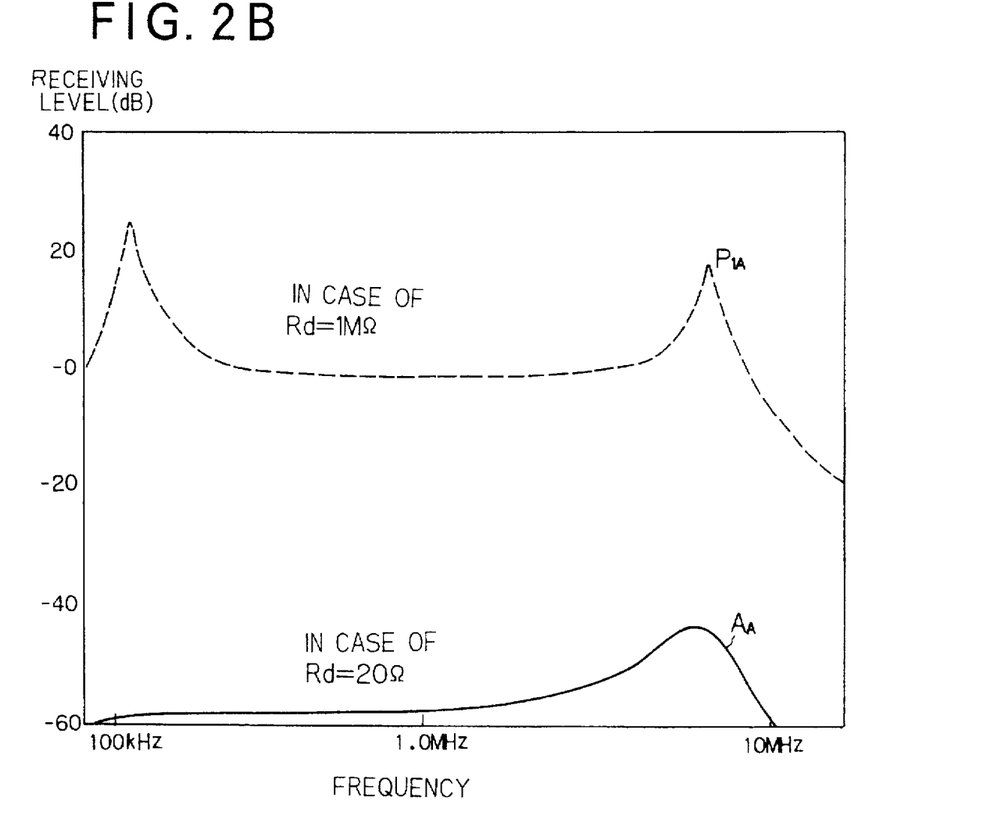
FIG. 2B is a frequency characteristic of the second embodiment of FIG. 2A.

FIG. 2A shows a circuit diagram of a receiver having an AGC circuit of the second embodiment, and FIG. 2B shows a graph of a simulation result of its characteristic.

In FIG. 2A, a receiver 20 is provided with: an antenna ANT having the antenna impedance at the MW band equivalent to the resistor Rs (=80Ω) and the capacitor Cs (=80 pF) connected in serial with the antenna induced voltage VIN; a coil $L_1$ (=several tens µH) as a LPF coil for cutting off the frequency not less than the SW band; a coil $L_2$ (=ten plus several mH) as a HPF coil for cutting off the frequency not more than the LW band; a FET A as an amplifier element; a capacitor Cgs (=15 pF) equivalent to the sum of the input capacitance and the stray capacitance of the FET A; diodes $D_{11}$ and $D_{12}$ connected, at the intermediate connection point thereof, to the intermediate connection point of the coils $L_{11}$ and $L_{12}$ for constituting the AGC; an electric current source Iagc for changing the operative resistance of the diodes $D_{11}$ and $D_{12}$; and a bypass capacitor $C_B$.

The receiver 20 is further provided with decoupling capacitors $C_{D1}$ and $C_{D2}$ for preventing the outflow of the direct current from flowing to the antenna side and the FET side, and the capacitance values thereof are set so as not to give influence to the AGC operation.

In this case, as the operative resistance Rd of the diodes $D_{11}$ and $D_{12}$ are lowered, the AGC is triggered to be operated, and the Q (Quality factor) of the coils is lowered (dumped).

As shown in the graph of FIG. 2B, the peak $P_{1A}$ at the vicinity of 8 MHz in case of Rd=1 MHz, is restrained to merely move to the peak $A_A$ when the AGC is sufficiently operated (i.e. in case of Rd=20Ω).

Therefore, in the receiving band range, the AGC range is not narrowed by the influence of this peak, by an unnecessary amount.

Further, although the range where the AGC characteristic is flat is narrowed as compared with the receiver 70 of FIG. 7B, the unnecessary peak is not practically generated and the preferred characteristic (i.e. the characteristic that the frequency dependency is small) is obtained.

Further, in the second embodiment, if the SW and VHF bands are to be cut off, it is possible to construct so as to divide the coil $L_1$ into the coil $L_{11}$ and the coil $L_{12}$ as equivalent to the coil $L_1$.

Figure 3:
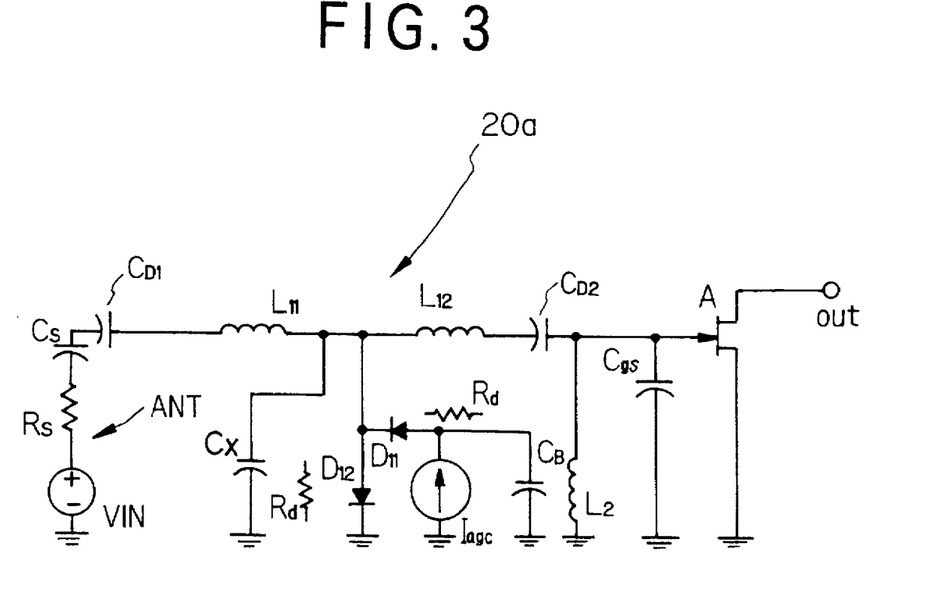
FIG. 3 is a circuit diagram of a receiver as a modified example of the second embodiment of FIG. 2.

In more detail, as shown in FIG. 3, a receiver 20a is provided with n (n: natural number more than two) pieces of coil elements, wherein a first coil portion corresponding to a coil $L_{11}$ is constructed by i (i=natural number not less than 1 and not more than (n−1)) pieces of coil elements, and a second coil portion corresponding to a coil $L_{12}$ is constructed by j (J=n−i) pieces of coil elements, so that a capacitor Cx having about 10 pF is added in the circuit.

Third Embodiment

The third embodiment can maintain the AGC range over a wider frequency band range, by restraining the peak at the vicinity of the 8 MHz in the same manner as the second embodiment.

Figure 4A:
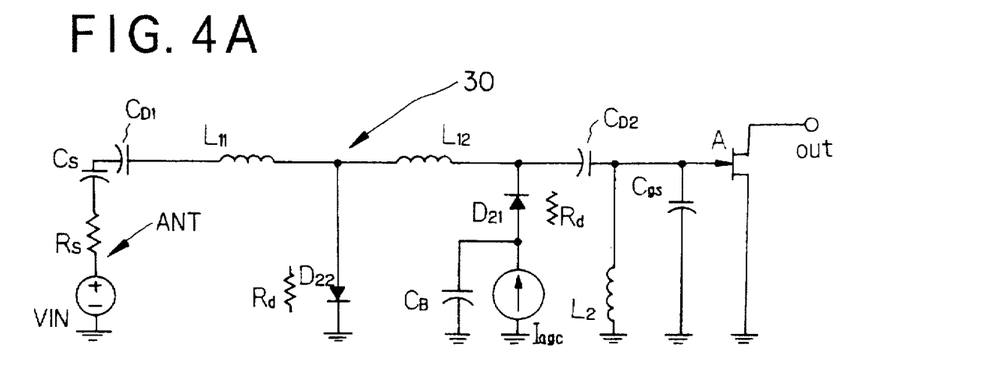
FIG. 4A is a circuit diagram of a receiver as a third embodiment of the present invention.
Figure 4B:
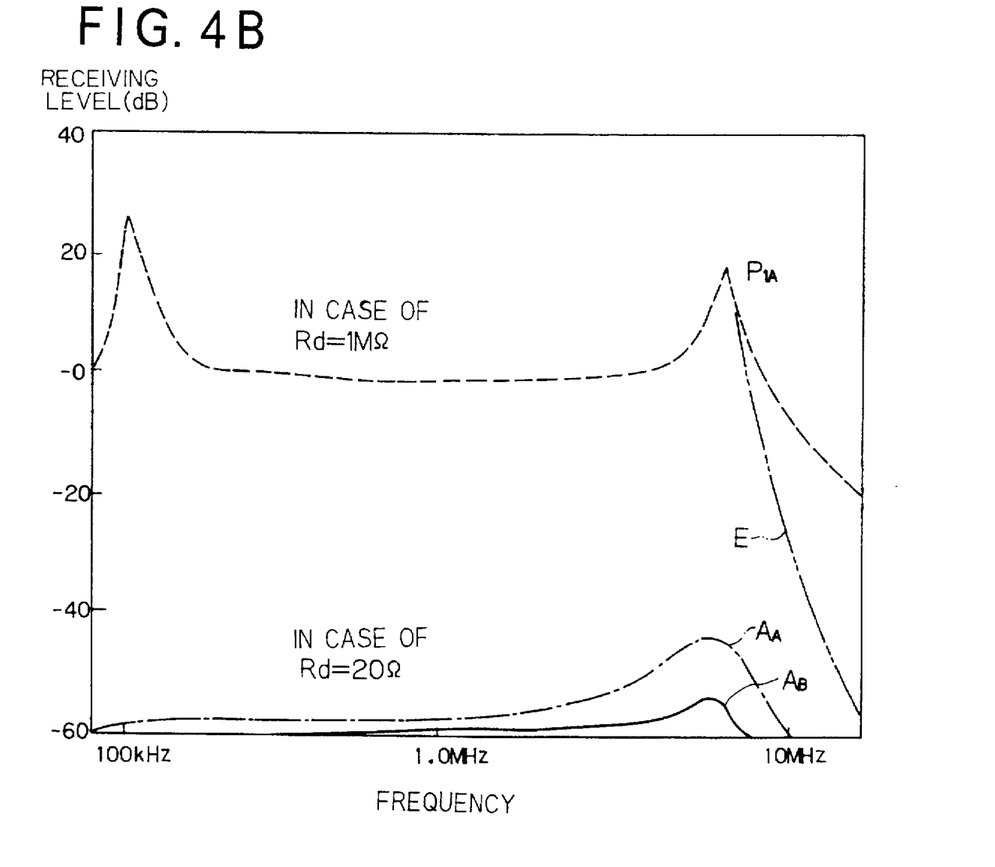
FIG. 4B is a frequency characteristic of the third embodiment of FIG. 4A.

FIG. 4A shows a receiver having an AGC circuit of a third embodiment, and FIG. 4B shows a graph of a simulation result of the characteristic thereof.

In FIG. 4A, a receiver 30 is provided with: an antenna ANT having an antenna impedance at the MW band equivalent to a resistor Rs (=several tens $\Omega$) and a capacitor Cs (=several tens pF) connected in serial with the antenna induced voltage VIN; a coil $L_{11}$ (=several μH) and a coil $L_{12}$ (=several tens μH) as a LPF coil for cutting off the frequency not less than the SW band; a coil $L_2$ (=ten plus several mH) as a HPF coil for cutting off the frequency not more than the LW band; a FET A as an amplifier element; a capacitor Cgs (=ten plus several pF) equivalent to the sum of the input capacitance and the stray capacitance of the FET A; a diode $D_{21}$ which cathode is connected to the output terminal side of the coil $L_{12}$; a diode $D_{22}$ connected in the forward direction to the point between the intermediated connection point of the coils $L_{11}$ and $L_{12}$ (corresponding to the first connection point) and the ground (corresponding to the third connection point); an electric current source Iagc connected to the point between the anode of the diode $D_{21}$ and the ground (corresponding to the third connection point) for changing the operative resistances of the diodes $D_{21}$ and $D_{22}$; and the bypass capacitor $C_B$.

In this case, the diodes $D_{21}$ and $D_{22}$, and the coil $L_{12}$ construct the AGC, and as the operative resistances Rd of the diodes $D_{21}$ and $D_{22}$ are lowered, the AGC is triggered to be operated, so that the Q of the coil is lowered (dumped).

With referring to the graph of FIG. 4B, the peak $P_{1A}$ at the vicinity of 8 MHz in case of Rd=1 M$\Omega$ is further controlled as indicated by the line $A_B$ as compared with the case of the second embodiment as indicated by the line $A_A$, when the AGC is sufficiently applied (i.e. in case of Rd=20$\Omega$). Thus, the AGC range can be sufficiently prepared in the receiving band range.

In the above embodiments, although the electrical current source Iagc and the bypass capacitor $C_B$ for changing the operative resistances of the diodes $D_1$ and $D_2$, are used, an electrical voltage source may be provided in place of the electrical current source and the bypass capacitor $C_B$.

In the third embodiment, although the coil equivalent to the coil $L_1$ is divided into the coil $L_{11}$ and the coil $L_{12}$, the coil may be divided into more than two coils in the range fulfilling the aforementioned condition. In more detail, n (n: natural number not less than 2) pieces of coil elements are prepared, wherein the first coil portion corresponding to the coil $L_{11}$ by i (i: natural number not less than 1 and not more than (n−1)) pieces of coil elements, and the second coil portion corresponding to the coil $L_{12}$ are constructed by (n−i) pieces of coil elements.

Figure 5:
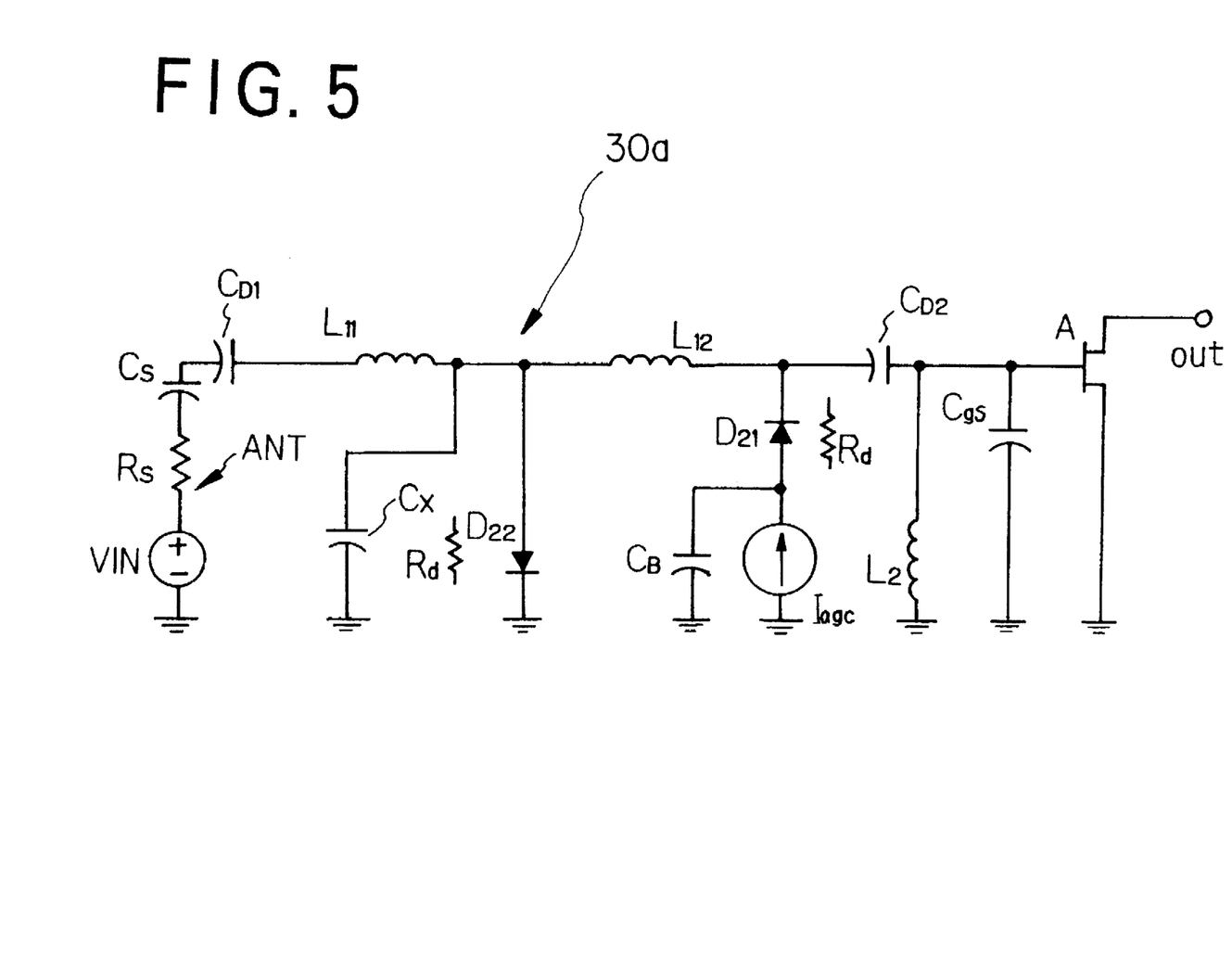
FIG. 5 is a circuit diagram of a receiver as one modified example of the third embodiment of FIG. 4.

As shown in FIG. 5, by adding a capacitor Cx having about 10 pF, the LPF having a LC double stage structure can be constructed in a receiver 30a, and further it becomes possible to remove the high frequency component outside of the receiving band range.

Figure 6:
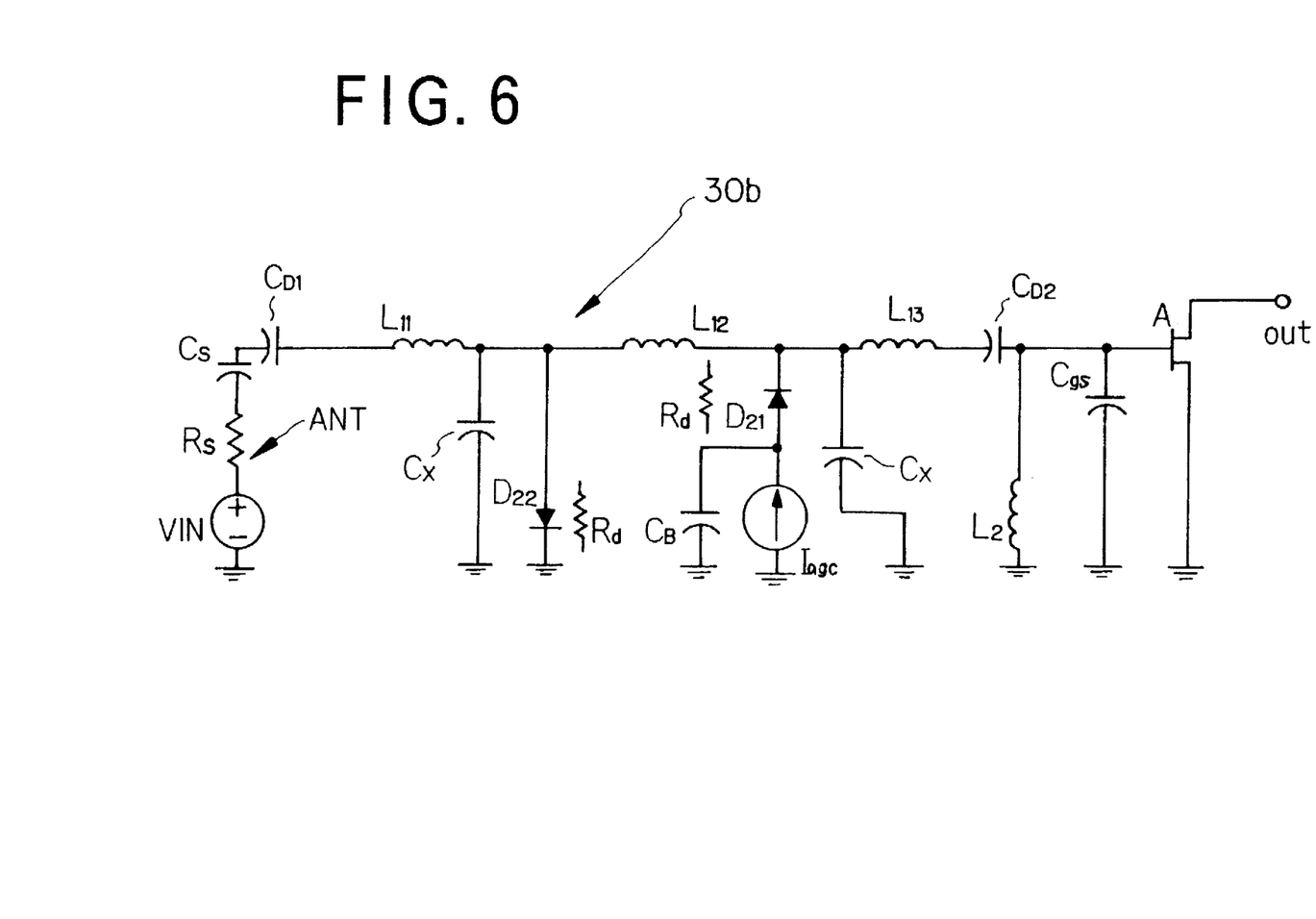
FIG. 6 is a circuit diagram of a receiver as another modified example of the third embodiment of FIG. 4.

Further, in the third embodiment, the coil equivalent to the coil $L_1$ is divided into the coil $L_{11}$ and the coil $L_{12}$. In more general, n (n: natural number not less than 2) pieces of coil elements are prepared, wherein the first coil portion corresponding to the coil $L_{11}$ is constructed by i (i: natural number not less than 1 and not more than (n−1)) pieces of coil elements, and the second coil portion corresponding to the coil $L_{12}$ is constructed by j (j: natural number not less than 1 and not more than (n−i−1)) pieces of coil elements. In order to cut off the SW and VHF band, the coil elements may be divided into the coils $L_{11}$, $L_{12}$ and $L_{13}$ equivalent to the coil $L_1$. In more detail, as shown in FIG. 6, n (n: natural number not less than 2) pieces of coil elements are prepared in a receiver 30b, wherein the first coil portion corresponding to the coil $L_{11}$ is constructed by i (i: natural number not less than 1 and not more than (n−1)) pieces of coil elements, the second coil portion corresponding to the coil $L_{12}$ is constructed by j (j: natural number not less than 1 and not more than (n−i)) pieces of coil elements, and the third coil portion corresponding to the coil $L_{13}$ having k (k=n−i−j) pieces of coil elements. According to this construction, as indicated by a line E in FIG. 4B, the SW and VHF bands can be effectively cut off.

Furthermore, as shown in FIG. 6, by adding a capacitor Cx having about 10 pF, a LPF having a triple LC stage structure can be constructed in the receiver 30b. In this case, the high frequency component other than the receiving band range can be removed, which characteristic is indicated by the line E in FIG. 4B.

As described above in detail, according to the embodiments of the present invention, a good AGC effect can be obtained in the receiving band range and especially in the upper side (i.e. high frequency side) of the receiving band range. The influence of the receiving disturbance due to the high frequency signal outside of the receiving band range can be reduced. The flatness of the AGC characteristic in the receiving band range can be maintained, so that the wide AGC range can be maintained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A receiver, to which a high frequency signal is inputted from an antenna for receiving the high frequency signal, said receiver comprising:

an amplifier element for amplifying the inputted high frequency signal;

n (n: natural number not less than 2) pieces of coil elements, which are serially connected between said antenna and an input side of said amplifier element and construct a low pass filter for the inputted high frequency signal; and an AGC circuit including an impedance variable means, which is connected at one end thereof to an intermediate connection point of two coil elements adjacently disposed in said n pieces of coil elements and is connected at the other end thereof to a ground, and which impedance between said one end and said the other end is varied in accordance with a level of the inputted high frequency signal, for controlling an input level of the inputted high frequency signal for said amplifier element by changing an attenuation characteristic thereof in accordance with the change in the impedance of said impedance variable means.

2. A receiver according to claim 1, wherein:

m (m: natural number not less than 1 and not more than (n−1)) pieces of said n pieces of coil elements, construct a first coil portion disposed between said antenna and said impedance variable means;

(n−m) pieces of said n pieces of coil elements construct a second coil portion between said impedance variable means and said amplifier element; and a self resonant frequency of said first coil portion is higher than that of said second coil portion.

3. A receiver according to claim 1, wherein:

m (m: natural number not less than 1 and not more than (n−1)) pieces of said n pieces of coil elements, construct a first coil portion disposed between said antenna and said impedance variable means;

(n−m) pieces of said n pieces of coil elements construct a second coil portion between said impedance variable means and said amplifier element; and a resonant frequency at the input side of said amplifier element is set to be higher than a receiving frequency range of said receiver in accompaniment with the change in the impedance of said impedance variable means.

4. A receiver according to claim 1, wherein said AGC circuit includes:

a pair of diodes connected, at an intermediate connection point thereof, to the intermediate connection point of the two coil elements; and an electric current source for supplying an electric current to the diodes to change operative resistances of the diodes, such that an AGC is operated when the operative resistances of the diodes are lowered.

5. A receiver, to which a high frequency signal is inputted from an antenna for receiving the high frequency signal, said receiver comprising:

an amplifier element for amplifying the inputted high frequency signal;

n (n: natural number not less than 2) pieces of coil elements, which are serially connected between said antenna and an input side of said amplifier element and construct a low pass filter for the inputted high frequency signal; and an AGC circuit including a resistance variable means, which is connected at one end thereof to an intermediate connection point of said n pieces of coil elements and said amplifier element and is connected at the other end thereof to a ground, and which resistance between said one end and said the other end is lowered when an input level of the inputted high frequency signal is lowered, for lowering a Q (Quality factor) of said coil elements by the change in the resistance of said resistance variable means while controlling the input level of the inputted high frequency signal for said amplifier element by changing an attenuation characteristic thereof.

6. A receiver according to claim 5, further comprising decoupling capacitors connected between said antenna and said AGC circuit and between said amplifier element and said AGC circuit for preventing a direct current from flowing to said antenna and said amplifier element from said AGC circuit, said decoupling diodes having capacitance values which practically give no influence to an AGC operation of said AGC circuit.

7. A receiver, to which a high frequency signal is inputted from an antenna for receiving the high frequency signal, said receiver comprising:

an amplifier element for amplifying the inputted high frequency signal;

n (n: natural number not less than 2) pieces of coil elements, which are serially connected between said antenna and an input side of said amplifier element, construct a low pass filter for the inputted high frequency signal, and is divided into first, second and third portions, said first portion having i (i: natural number not less than 1 and not more than (n−1)) pieces of said n pieces of coil elements disposed between said antenna and a first connection terminal, said second coil portion having j (j: natural number not less than 1 and not more than (n−i)) pieces of said n pieces of coil elements disposed between said first connection terminal and a second connection terminal, said third coil portion having k (k=n−i−j) pieces of said n pieces of coil elements disposed between said second connection terminal and said amplifier element; and an AGC circuit including a resistance variable means, which is connected at one end thereof to said first connection terminal and said second connection terminal respectively and is connected at the other end thereof to a ground, and which resistances of said resistance variable means between the first connection terminal and the ground and between the second connection terminal and the ground are lowered when an input level of the inputted high frequency signal is lowered, for lowering a Q (Quality factor) of said coil elements by the change in the resistances of said resistance variable means while controlling an input level of the inputted high frequency signal for said amplifier element by changing an attenuation characteristic thereof.

8. A receiver according to claim 7, wherein a self resonant frequency of said first coil portion is set to be higher than that of said second and third coil portions in combination.

\* \* \* \* \*

UNITED STATES PATENT AND TRADEMARK OFFICE
CERTIFICATE OF CORRECTION

PATENT NO. : 5,532,647
DATED : July 2, 1996
INVENTOR(S) : Yasuo Kawakami

It is certified that error appears in the above-indentified patent and that said Letters Patent is hereby corrected as shown below:

On the title page, Item [54], correct the title of the invention to read as follows:

--RECEIVER HAVING AGC CIRCUIT--

Signed and Sealed this

Tenth Day of December, 1996

Attest:

BRUCE LEHMAN

Attesting Officer

Commissioner of Patents and Trademarks